United States Patent [19]

Ibe et al.

[11] Patent Number: 5,009,864
[45] Date of Patent: Apr. 23, 1991

[54] RECHARGING DEVICE FOR CZOCHRALSKI METHOD

[75] Inventors: Hiroyuki Ibe; Toshiharu Uesugi, both of Fukui, Japan

[73] Assignee: Shin-Etsu Handotai Company Limited, Tokyo, Japan

[21] Appl. No.: 426,293

[22] Filed: Oct. 25, 1989

[30] Foreign Application Priority Data

Oct. 27, 1988 [JP] Japan ................................ 63-269576

[51] Int. Cl.$^5$ ..................... C30B 35/00; C30B 15/02; B66C 1/66
[52] U.S. Cl. .................................................. 422/249
[58] Field of Search ............ 422/245, 248, 249; 156/605, 617.1, DIG. 98, DIG. 115; 294/115; 279/106, 109, 35, 77

[56] References Cited

U.S. PATENT DOCUMENTS

| | | | |
|---|---|---|---|
| 2,507,549 | 5/1950 | Smith et al. | 294/115 |
| 3,156,496 | 11/1964 | Davidson | 294/115 |
| 4,659,421 | 4/1987 | Jewett | 156/605 |

FOREIGN PATENT DOCUMENTS

| | | | |
|---|---|---|---|
| 1147366 | 4/1963 | Fed. Rep. of Germany | 294/115 |
| 2619800 | 3/1989 | France | 294/115 |

Primary Examiner—Gary P. Straub
Assistant Examiner—Stephen G. Kalinchak
Attorney, Agent, or Firm—Lowe, Price, LeBlanc, Becker & Shur

[57] ABSTRACT

A recharging device suitable for use in a Czochralski-type monocrystal ingot pulling apparatus, includes a shaft (3) which is suspended from a pulling element (1), a ring slider (8) capable of sliding along the shaft, a stopper (20) for stopping the downward movement of the ring slider, a pair of hooks (9, 11, 13) pivotably connected to the shaft below the ring slider and capable of assuming hooking and unhooking positions, and a pair of rods (16) each having one end connected to the hooks such that when the ring slider slides upward relative to the shaft the pair of the rods cause the hooks to assume their unhooking position, and when the ring slider slides downward relative to the shaft the rods cause the hooks to assume their hooking position.

7 Claims, 3 Drawing Sheets

RECHARGING DEVICE FOR CZOCHRALSKI METHOD

FIELD OF THE INVENTION

The present invention relates to a device for recharging semiconductor raw material in a monocrystal ingot pulling apparatus based on the Czochralski method and, more particularly, to a recharging device for replenishing a crucible provided in the monocrystal ingot pulling apparatus with polycrystalline substance such as polycrystalline silicon during a series of monocrystal ingot pulling operation.

BACKGROUND OF THE PRIOR ART

In a conventional method of manufacturing a semiconductor monocrystal, such as silicon monocrystal, based on the known Czochralski technique, a series of monocrystal ingot pulling operations mainly comprise the following steps: (i) a batch of semiconductor substance (e.g., silicon) is charged in the crucible, (ii) the crucible is heated by means of resistance heating, or high-frequency heating, whereby the semiconductor substance is melted, (iii) a seed crystal fixedly held by a pulling means is dipped in the surface of the melt, (iv) the pulling means is slowly turned and lifted up at a raising rate of several millimeters per minute whereby the grown monocrystal is pulled up above the surface of the melt, (v) the steps (iii) and (iv) are repeated until the melt in the crucible is nearly depleted, (vi) the crucible is cooled down so that the crucible can be charged with a new batch of semiconductor substance.

However, in the above manufacturing operation based on a batch charging system, since the furnace as well as the crucible must be cooled down to allow replenishment of the crucible each time the crucible is nearly empty, the number of monocrystal ingots raised in a series of the operation is small and therefore rate at which the ingots are produced is so small that it is difficult to improve the productive efficiency, furthermore, the risk of breakage of the expensive crucible is relatively high due to the difference in thermal expansion coefficient between the crucible and the semiconductor substance therein. Therefore, it is desirable that the semiconductor substance is fed in the melt held in the crucible between pulling operations so as to relieve the crucible from the necessity of being frequently cooled down.

In the above operation of the conventional manufacturing apparatus for raising grown semiconductor monocrystal ingot, one series of monocrystal raising steps is terminated when a limited number of monocrystal rods have been raised; during the downtime the crucible is replenished with the high-purity semiconductor polycrystal substance, the weight of which is equal to the weight of the grown and raised monocrystal substance; and thereafter the next series of the monocrystal raising steps is initiated. This operation of replenishing is conventionally called as "recharging", for the crucible is charged with the semiconductor polycrystal substance anew.

As already stated, in this procedure of recharging, it is necessary to let the whole furnace cool down before recharging the crucible with fresh semiconductor substance, so that this procedure is time-consuming and acts as a bottleneck impeding productive efficiency. Also, the increased frequency of heating and cooling of the expensive crucible renders the crucible more liable to breakage. However, if the furnace were kept uncooled during the recharging in the open air and thus if the remnant semiconductor substance in the crucible were kept molten, the molten semiconductor substances (e.g., molten silicon) and the intra-furnace carbon-made structural members as well as insulator kept at high temperatures could burn in the air. Therefore, while the furnace is being heated, it is absolutely impossible to replenish the hot crucible in ambient air in the same manner as the initial batch of the semiconductor substance is charged in the crucible before heating the furnace.

Various proposals have been made of recharging devices which enable additional of semiconductor substances to a crucible without the necessity of having a furnace cooled down. For example, the devices disclosed by Japanese Provisional Patent Publication (Kokai) No. 57-95892 (1982), Japanese Provisional Patent Publication (Kokai) No. 58-95548 (1983), and Japanese Provisional Patent Publication (Kokai) No. 58-170533 (1983) are basically related to the same system comprising a hollow metallic cylinder internally lined with quartz and having a movable door means in the bottom which is opened by means of an operation of a wire system. Lumps of semiconductor substance are dropped from the door. However, it is necessary to solidify the surface of the melt before dropping the semiconductor substance from this system, and a complicated operation is required so as to prevent several lumps of semiconductor substance from falling at once, and, what is more, a quartz-lined pipe must be provided, which makes the construction of the monocrystal ingot pulling apparatus extremely complicated. Also, in these proposed devices, since lumps of semiconductor substance are used as the additional supply, it is necessary to sort them by size, and this creates an opportunity for contamination of the high-purity semiconductor substance.

Another method is also proposed wherein a fresh semiconductor substance is supplied in the form of a rod. In this method, a rod of the semiconductor substance is suspended from a pulling means via a wire one end of which is tied at the top portion of the rod, and the rod is lowered at a constant rate to thereby cause the bottom portion of the rod to be submerged and gradually melted in the melt contained in the crucible. However, in this system the top portion of the rod at which the wire is tied cannot be dipped in the melt for if the wire melts in it the purity of the semiconductor melt is lowered. As a result, the top portion of the rod is always left unused and this creates a difficulty of obtaining a precise controlling of the weight of recharging of the semiconductor substance.

The present invention is intended to solve the above problems, and it is an object of the invention to provide a recharging device which is simple in construction as well as in operational procedure, and with which it is possible to improve the productive efficiency.

SUMMARY OF THE INVENTION

In order to attain the above-described object and others, this invention provides a recharging device to be installed in a monocrystal ingot pulling apparatus based on Czochralski method.

According to a preferred embodiment of the invention, a recharging device suitable for use with the Czochralski method comprises:

a shaft means (3) capable of being vertically suspended from a pulling means (1) of a Czochralski-type monocrystal ingot pulling apparatus, a slider means (8) capable of freely sliding along the shaft means, a stopper means (20) capable of stopping the downward movement of the slider means, a pair of hook menas (9, 11, 13) pivotally connected to the shaft means below the slider means and capable of assuming hooking and unhooking positions, and a pair of rod means (16) having upper ends flexibly connected to the slider means and having lower ends pivotably connected to the respective hook means such that when the slider means slides upward relative to the shaft means the hook means are caused to assume an unhooking (open) position, and when the slider slides downward relative to the shaft means the hook means are caused to assume a hooking (closed) position.

According to another preferred embodiment of the invention, a recharging device for a Czochralski method comprises:

a shaft capable of being vertically suspended from a pulling means of a Czochralski-type monocrystal ingot pulling apparatus, a disk ring provided about the shaft and capable of sliding along the shaft, a stopper capable of stopping the downward movement of the disk ring, a pair of symmetrical arms each consisting of a first link having its upper end pivotably connected to the shaft below the disk ring, a second link having its upper end pivotably connected to the lower end of the first link, and an inwardly bent L-shaped hook fixedly connected to the lower end of the second link, a pair of rods having the upper ends flexibly connected to the disk ring and having lower ends pivotably connected to the substantially middle portion of the corresponding first links such that when the disk ring slides upward relative to the shaft the rods pull the arms upward to thereby cause the pair of the L-shaped hooks to move outwardly and when the disk ring slides downward relative to the shaft the rods pushed the arms downward to thereby cause the pair of the L-shaped hooks to move toward each other.

Preferably, the shaft is cylindrical and has a vertical slit in it in which the first links of the symmetrical arms are pivotably connected to the shaft.

The semiconductor substance to be additionally supplied into the crucible provided in the monocrystal ingot pulling apparatus by means of the recharging device of the invention must be in the form of a rod having recesses at the top portion. At first, the rod of the semiconductor substance is hooked on the set of hook means of the recharging device. The weight of the semiconductor rod urges the hook means to stay in the hooking position securely. Then, the pulling means from which the shaft means of the recharging device of the invention is suspended is gradually lowered so that the semiconductor rod is dipped in the molten semiconductor substance contained in the crucible whereby the semiconductor rod melts to join the molten semiconductor substance in the crucible. When the length of the semiconductor rod hooked from the hook means of the recharging device of the invention is reduced to a predetermined short length, the slider means comes in contact with the stopper means whereby the slider means is prevented from descending any farther so that the slider means starts to slide upward relative to the descending shaft means. As the slide means slides upward relative to the shaft means, the slide means pulls the set of hook means via the set of rod means whereby the hook means are caused to assume an unhooking position to thereby unhook and drop the remaining short length of semiconductor rod into the melt.

In a monocrystal ingot pulling apparatus based on Czochralski method provided with a recharging device of the invention, it is possible to continually replenish the crucible with supplementary semiconductor substance without cooling down the furnace. Since the semiconductor rod is dipped in the melt and melted gradually, there is no need for solidifying the surface of the melt. As a high-purity semiconductor rod is used, there is no need for sorting the semiconductor substance which is required as in the case of using lumps of semiconductor substance. Also, since the entire body of the semiconductor rod is added to the melt, it is possible to precisely control the weight of the replenishment. The number of monocrystal ingots which are thus raised in a series of monocrystal ingot pulling operations is greatly increased and the downtime is minimized so that the productive efficiency is improved. Theoretically, it is possible that the monocrystal pulling operation can be repeated without any significant downtime until an intra-furnace carbon-made structural member, an insulator, or the quartz crucible becomes unusable due to natural losses in the high temperature use.

The above and other objects and features of the invention will be understood more fully hereinafter by reference to the following description in connection with the accompanying drawings.

DETAILED DESCRIPTION OF THE INVENTION

One of the preferred embodiments of the present invention will be explained with reference to, FIGS. 1 through 3 described above.

Figure 1:
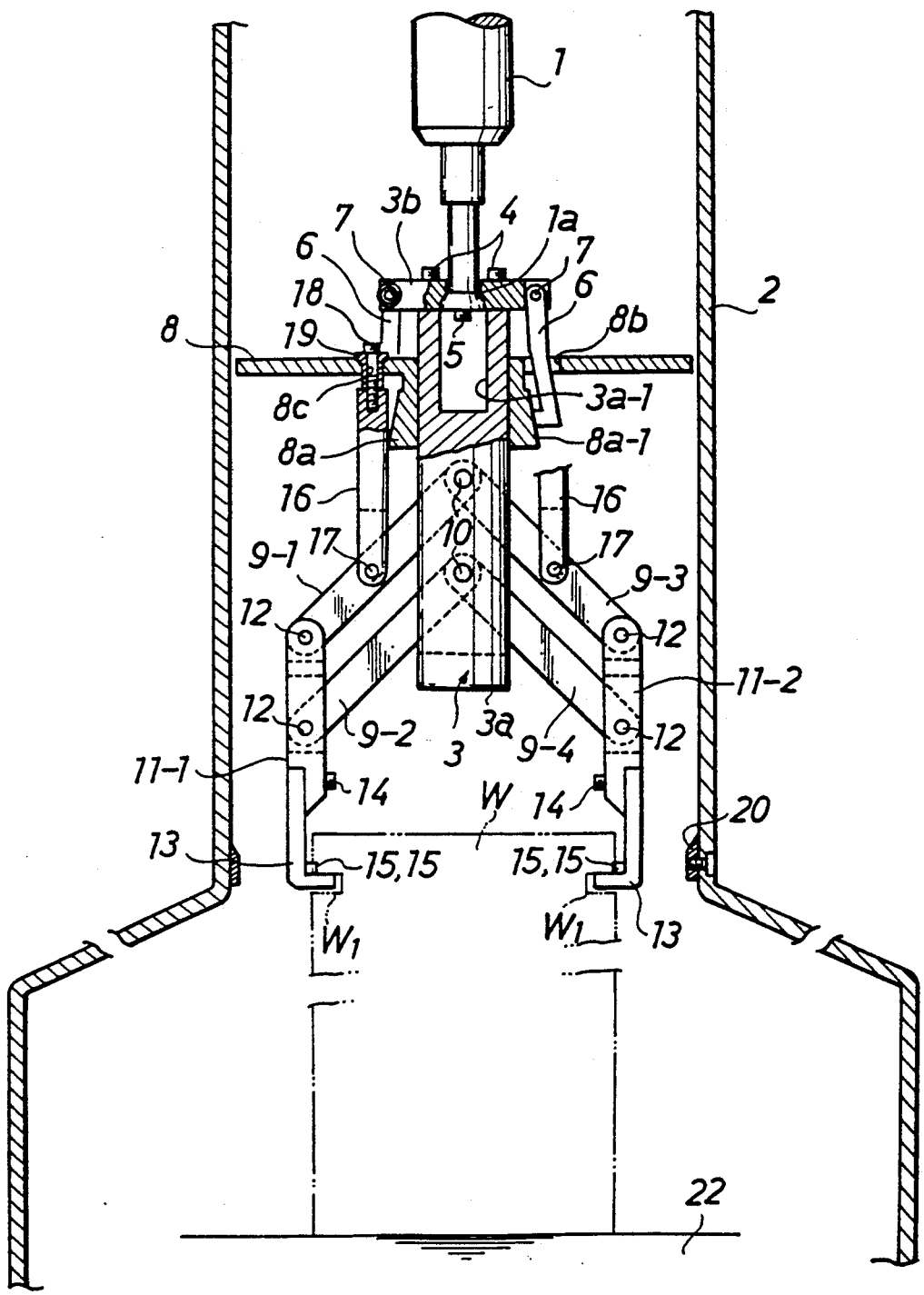
FIG. 1 is a fragmentary cross-sectional front view of a recharging device according to a preferred embodiment of the present invention.
Figure 2:
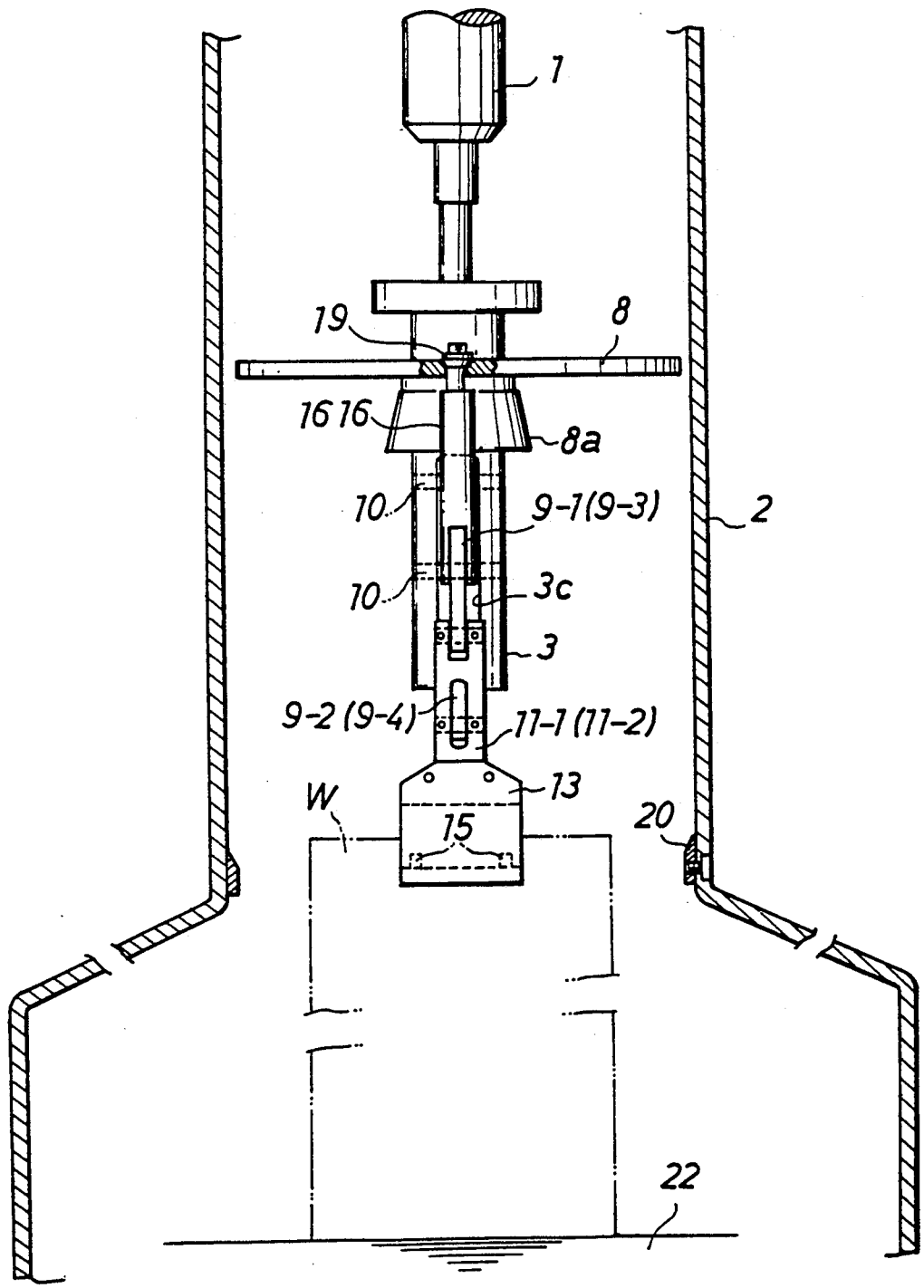
FIG. 2 is a fragmentary cross-sectional side view of the same recharging device shown in FIG. 1.
Figure 3:
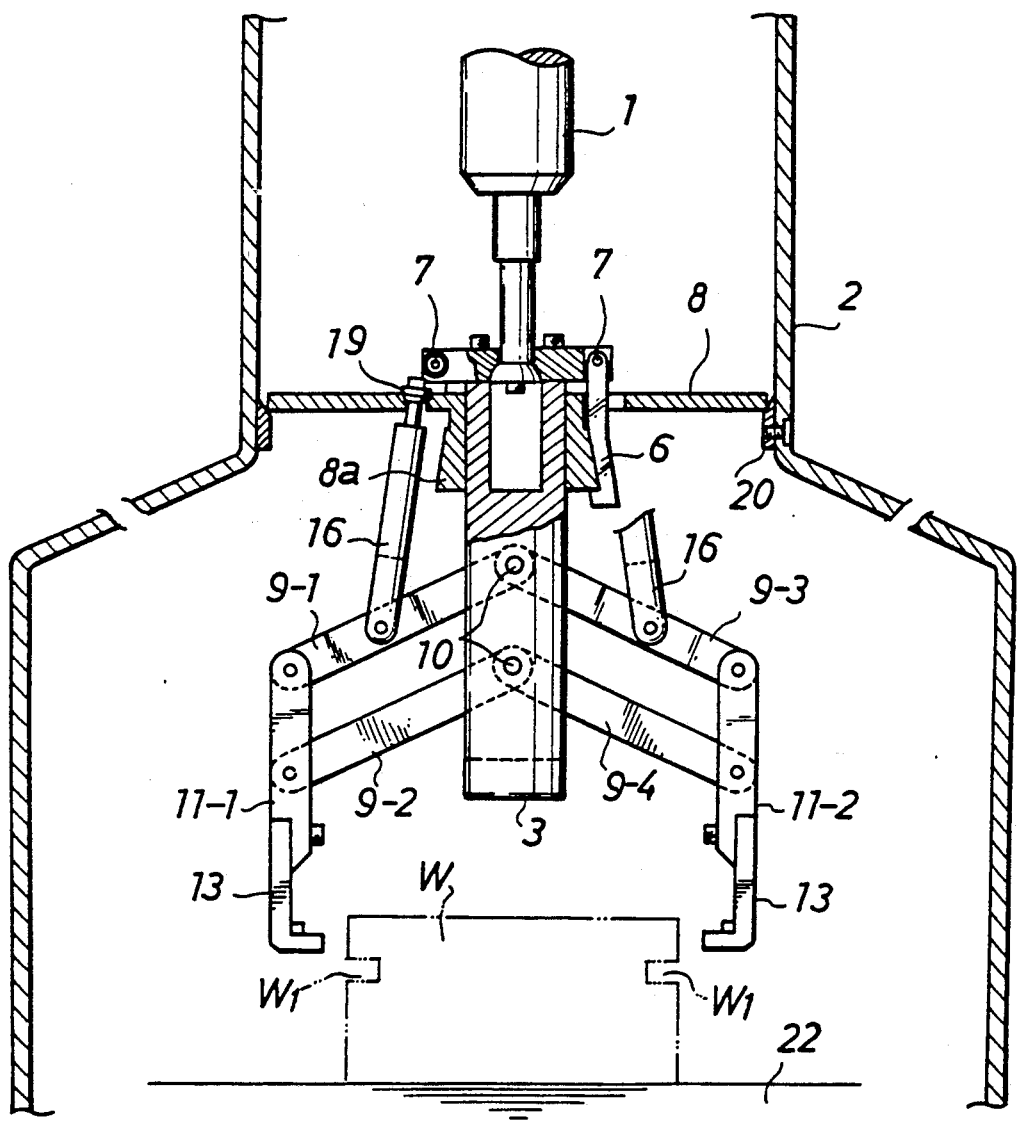
FIG. 3 is a drawing similar to FIG. 1 showing the operation of the same recharging device.

FIG. 1 is a fragmentary cross-sectional front view of a recharging device of the invention, FIG. 2 is a fragmentary cross-sectional side view of the same recharging device, and FIG. 3 is a drawing similar to FIG. 1 showing the operation of the same recharging device.

In these figures, a pulling means 1 is rotatable about its center line and also can reciprocate in the direction of the center line, which extends vertically. This pulling means 1 is housed in a chamber 2, which has a bell-like open end below. A shaft 3 is suspended from the bottom of the pulling means 1. The main body 3a of the shaft 3 has a coaxial cylindrical cavity 3a-1 in its upper portion. A ring 3b is firmly connected onto the top of the main body 3a of the shaft 3 by means of bolts 4. As shown in FIG. 1, the vacancy of this ring 3b has a circularly arcuate profile. A hemispherical boss 1a, which is fixedly connected to the bottom of a thin shaft extending from the pulling means 1 by means of a bolt 5, also has a circular profile of a radius of curvature slightly smaller than that of the arcuate profile of the vacancy of the ring 3b, and thus the ring 3b is hooked on the hemispherical boss 1a such that their curved faces come in slidable contact with each other allowing self-aligning movement of the shaft 3 so that the shaft 3 is always suspended vertically.

A pair of small, horizontal and parallel shafts 7 are provided in the periphery of the ring 3b at diametrically opposite locations. A pair of lock levers 6 have their upper ends pivotably connected to these shafts 7 such that they can freely swing about the shafts 7.

A generally disc-shaped holder plate 8 having a hole in the middle is slidably engaged with the shaft 3 such that the holder plate 8 can slide vertically on the periphery of the shaft 3. The holder plate 8 has a boss 8a protruding coaxially from the bottom face thereof, which 8a has a general shape of truncated cone tapering upwardly. In FIG. 1 the crooked free end of one of the lock levers 6 is seen to rest on the tapered side face 8a-1 of the boss 8a. Incidentally, bores 8b are provided in the holder plate 8 (only one of them is shown in FIG. 1), and the lock levers 6 extend through them and are not touched by the holder plate 8 by virtue of these bores 8b.

Also, in the shaft 3 there is provided a penetrating slit 3c passing the center line of the shaft 3 below the cavity 3a-1, and extending normal to the plane of FIG. 2. Two pins 10 penetrating the shaft 3 diametrically are provided across the slit 3c. The pins 10 are normal to the plane of FIG. 1. One pin 10 is located substantially above the other pin 10. The upper pin 10 pivotally secures upper ends of links 9-1 and 9-3. The link 9-1 extends from the slit 3c in one direction and the link 9-3 in the opposite direction. The lower pin 10 pivotally secures upper ends of links 9-2 and 9-4. The link 9-2 extends from the slit 3c approximately in the same direction as the link 9-1, and the link 9-4 extends approximately in the same direction as the link 9-3. The lower ends of the links 9-1 and 9-2 are pivotally connected to a support arm 11-1 by means of pins 12. The lower ends of the links 9-3 and 9-4 are pivotally connected to a support arm 11-2 by means of pins 12. Both support arms 11-1 and 11-2 are provided with hands 13 at their lower ends with bolts 14 fastening the hands 13 to the arms.

The hands 13 have an L-shaped profile, and is adapted to hook a rod W of a semiconductor substance (e.g. silicon rod), by engaging with a pair of recesses $W_1$ provided in the periphery of and near the top of the semiconductor rod W. Each hand 13 is provided with a pair of pins 15 for abutting to the periphery of the semiconductor rod W.

The holder plate 8 has two circular through holes 8c made therein. Each hole 8c receives a sleeve 19 of a link rod 16 whose lower end is pivotally connected to the link 9-1 or 9-3 by means of a pin 17 provided roughly in the middle of the link 9-1 or 9-3. Each sleeve 19 is firmly held onto the top of the link rod 16 by respective bolt 18. The size of the holes 8c are large enough to allow the link rods 16 to freely shift in and slant about the holes 8c.

A ring stopper 20 is provided on the inner wall of the chamber 2 at a location which is at a predetermined distance from the bottom of the chamber 2.

Next, referring to FIGS. 1 through 3, the procedural manner in which the recharging device of the invention is effectively operated will be explained.

As shown in FIGS. 1 and 2, when a semiconductor rod W is suspended from the recharging device with the recesses $W_1$ hooked at the L-shaped ends of the hands 13 of the support arms 11-1 and 11-2, the weight of the semiconductor rod W urges the support arms 11-1 and 11-2 to close inwardly whereby the semiconductor rod W is firmly hooked and suspended vertically.

As the pulling means 1 is caused to descend gradually in the chamber 2, the semiconductor rod W is dipped in the melt 22 contained in a crucible, not shown, and the submerged portion of the semiconductor rod W is melted to thereby add semiconductor substance to the melt 22.

As this operation of supplying semiconductor substance to the crucible proceeds, the length of the semiconductor rod W is reduced, and when the length becomes a sufficiently small predetermined length, the disc-shaped holder plate 8 is caught by the stopper 20, as shown in FIG. 3. When this occurs, the descending movement of the holder plate 8 as well as the shaft 3 ceases and the pulling means 1 alone descends with the hemispherical boss 1a entering the cylindrical cavity 3a-1. Eventually the bolt 5 hits upon the bottom of the cylindrical cavity 3a-1 and the descending movement of the pulling means 1 urges the shaft 3 to restart descending. Consequently, the shaft 3 begins to slide down through the central hole made in the holder plate 8 and the boss 8a urged by the downward movement of the pulling means 1. As the shaft 3 descends through the central hole of the holder plate 8, the distance between the ring 3b and the holder plate 8 reduces, and the pins 10 descend relative to the pins 17, which 17 are no longer able to descend because the link rod 16 is held by the now stationary holder plate 8. Thus the link 9-1 is caused to turn about the pin 10 clockwise, while the link 9-3 is caused to turn about the pin 10 counter-clockwise, as viewed in FIG. 3. This turning causes the support arms 11-1 and 11-2 to move outwardly to thereby urge the hands 13 to move away from the recesses $W_1$ and to drop the remnant of the semiconductor rod W into the crucible. The links 9-2 and 9-4 prevent the support arms 11-1 and 11-2 from swinging after dropping the semiconductor rod W.

Incidentally, as the shaft 3 descends relative to the holder plate 8, the lower ends of the lock levers 6 slide down on the tapered side face 8a-1 of the boss 8a, and at about the same time as the support arms 11-1 and 11-2 are caused to move outwardly to drop the semiconductor rod W, the lock levers 6 engage with the lower peripheral edge of the boss 8a, as shown in FIG. 3. Therefore, when the pulling means 1 is caused to ascend again with the shaft 3, it also lifts up the holder plate 8, and the support arms 11-1 and 11-2 are kept spread apart while they too are lifted up. FIG. 3 shows how the recharging device is lifted up again.

In the above embodiment, the recharging device simply consists of the shaft 3, the holder plate 8, the links 9-1, 9-2, 9-3, and 9-4, support arms 11-1 and 11-2, etc.; in the operation of recharging the semiconductor substance, this recharging device is easily connected to the pulling assembly 1; and recharging of the semiconductor substance W is possible simply by lowering the pulling means 1 while the series of monocrystal rod growing operation is not discontinued: so that the furnace does not have to be cooled and the operation efficiency is significantly improved.

Incidentally, in the above embodiment, the pulling means 1 is a shaft, but it is possible to employ a wire for the pulling means 1. Also, in the above embodiment, the remnant of the semiconductor rod W is dropped in the crucible when the holder plate 8 is caught by the stopper 20 provided on the inner wall of the chamber 2 and the support arms 11-1 and 11-2 are urged outwardly, but it is possible to do away with the holder plate 8, lock levers 6, link rods 16, etc., if two lengthwise and parallel cuts near and along the axis are made in the upper half of the semiconductor rod W, e.g. by a diamond cutter. In this case, since the specific gravity of semiconductor material (such as silicon) is usually smaller than that of melted semiconductor material, the semiconductor material tends to float on the melt, and when the lower half of the semiconductor is melted, the remnant of the semiconductor material separates into three parts by virtue of the two cuts. The middle part goes down first, and the two other parts unhook themselves from the hands 13 to go down into the melt, so that the replenishment of the semiconductor material can be performed smoothly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A recharging apparatus suitable for use in forming monocrystal ingots by the Czochralski method, comprising:
    a vertical conduit having disposed therein a recharging device comprising a shaft means capable of being vertically suspended from a pulling means of a Czochralski-type monocrystal ingot pulling apparatus for providing movable support therein;
    slider means for providing support while freely sliding along the shaft means and slidably guided within said vertical conduit;
    a pair of hook means pivotably connected to the shaft means below the slider means and capable of assuming hooking and unhooking positions for selectively supporting an element of a replenishment material;
    a pair of rod means having respective upper ends flexibly connected to the slider means and having respective lower ends pivotably connected to the respective hook means such that when the slider means slides upward relative to the shaft means the hook means are caused to assume said unhooking position, and when the slider slides downward relative to the shaft means the hook means are caused to assume said hooking position; and
    stopper means provided in said vertical conduit for stopping a downward movement of the slider means when the slider means makes contact with the stopper means.

2. A recharging apparatus as claimed in claim 1, wherein:
    said shaft means comprises a cylindrical shaft;
    said slider means comprises a disk ring slidably engaged with the cylindrical shaft;
    said pair of hook means comprise a pair of symmetrical arms each consisting of a first link having an upper end pivotably connected to the cylindrical shaft below the disk ring, a second link having an upper end pivotably connected to the lower end of the first link, and an inwardly bent L-shaped hook fixedly connected to the lower end of the second link; and
    said pair of rod means comprise a pair of rods having respective upper ends flexibly connected to the disk ring and having respective lower ends pivotably connected to the substantially middle portion of the corresponding first links, such that when the disk ring slides upward relative to the cylindrical shaft the rods pull the arms upward to thereby cause the pair of the L-shaped hooks to move outwardly and when the disk ring slides downward relative to the shaft means the rods push the arms downward to thereby cause the pair of the L-shaped hooks to move toward each other.

3. A recharging apparatus as claimed in claim 2, wherein:
    said cylindrical shaft is formed to have a vertical slit in which the first links of the symmetrical arms are pivotably connected to the shaft.

4. A recharging apparatus as claimed in claim 1, wherein:
    said stopper means comprises a ring-like element disposed with respect to said movable slider means to stop movement thereof so as to cause said hook means to release and drop said element into a crucible of said apparatus.

5. A recharging apparatus as claimed in claim 2, wherein:
    said stopper means comprises a ring-like element disposed with respect to said movable slider means to stop movement thereof so as to cause said hook means to release and drop said element into a crucible of said apparatus.

6. A recharging apparatus suitable for use in forming monocrystal ingots by the Czochralski method, comprising:
    a vertical conduit having disposed therein a recharging device comprising a wire means capable of being vertically suspended from a pulling means of a Czochralski-type monocrystal ingot pulling apparatus for providing movable support therein;
    slider means for providing movable support while freely sliding along the wire means and slidably guided within said vertical conduit;
    a pair of hook means pivotably connected to the wire means below the slider means and capable of assuming hooking and unhooking positions for selectively supporting an element of a replenishment substance;
    a pair of rod means having respective upper ends flexibly connected to the slider means and having respective lower ends pivotably connected to the respective hook means such that when the slider means slides upward relative to the wire means the hook means are caused to assume said unhooking position, and when the slider slides downward relative to the shaft means the hook means are caused to assume said hooking position; and
    stopper means provided in said vertical conduit for stopping a downward movement of the slider means when the slider means makes contact with the stopper means.

7. A method for recharging an apparatus for pulling a single crystal to form the same from melted material held in a crucible according to the Czochralski method by operating a recharging device disposed within a vertical conduit thereof which comprises a shaft means capable of being vertically suspended from a pulling means of the Czochralski-type monocrystal ingot pulling apparatus, a slider means capable of freely sliding along the shaft means, a stopper means provided within said vertical conduit capable of stopping a downward movement of the slider means, a pair of cooperating hook means pivotably connected to the shaft means below the slider means and capable of assuming hooking and unhooking positions, and a pair of rod means having upper ends flexibly connected to the slider means and having lower ends pivotably connected to respective hook means such that when the slider means slides upwardly relative to the shaft means the hook means are caused to assume their unhooking position and when the slider means slides downwardly relative to the shaft means the hook means are caused to assume their hooking position, the method comprising the steps of:

causing said hook means to assume the hooking position thereof, by causing said slider means to slide downwardly relative to the shaft means, to thereby hook to a polycrystal rod;

causing said pulling means of the apparatus to descend gradually to lower said hooked polycrystal rod toward said crucible of said apparatus;

dipping a dipping end of the polycrystal rod in molten material contained in the crucible to thereby enable said dipping end portion of the polycrystal rod to melt in the crucible;

causing said pulling means to descend further to thereby allow the slider means to be caught by the stopper means, whereby further descending movement of the slider means is prohibited; and causing said pulling means to descend still further to urge the shaft means to descend correspondingly further whereby said slider means is forced to slide upwardly relative to the shaft means, which in turn causes the hook means to assume said unhooking position thereof, whereupon an unmelted remnant of the polycrystal rod is dropped into said molten material in said crucible.

* * * * *